United States Patent [19]

Sanders

[11] Patent Number: 4,710,445
[45] Date of Patent: Dec. 1, 1987

[54] RESIST IMAGEABLE PHOTOPOLYMERIZABLE COMPOSITIONS

[75] Inventor: James F. Sanders, St. Joseph Township, County St. Croix, Wis.

[73] Assignee: Minnesota Mining and Manufacturing Company, St. Paul, Minn.

[21] Appl. No.: 854,850

[22] Filed: Apr. 22, 1986

[51] Int. Cl.[4] .................... G03C 11/12; G03C 3/00; G03C 1/727
[52] U.S. Cl. .................................. 430/252; 430/257; 430/286; 430/287; 430/260; 430/293; 522/94
[58] Field of Search ............... 430/257, 252, 286, 287, 430/260, 293; 522/94

[56] References Cited

U.S. PATENT DOCUMENTS 4,205,018  5/1980  Nagasawa et al. ............... 522/94 X
4,295,947 10/1981  Ohtani et al. ...................... 522/94 X

FOREIGN PATENT DOCUMENTS 2085023  4/1982  United Kingdom ................ 430/287

*Primary Examiner*—John E. Kittle
*Assistant Examiner*—Cynthia Hamilton
*Attorney, Agent, or Firm*—Donald M. Sell; James A. Smith; Mark A. Litman

[57] ABSTRACT

Photopolymerizable compositions containing thermally-softenable, developer resistive polymeric binders are particularly useful in image transfer systems and processes.

24 Claims, No Drawings 4,710,445

RESIST IMAGEABLE PHOTOPOLYMERIZABLE COMPOSITIONS

BACKGROUND OF THE INVENTION

1. Field of the Invention

This invention relates to photopolymerizable compositions and particularly to negative-acting, photopolymerizable compositions useful in color prepress proofing constructions using a single receptor sheet to receive multiple color images on a single surface.

2. Background of the Art

Photopolymerizable compositions are used in numerous commercial applications. Negative-acting photopolymerizable compositions are used in presensitized printing plates (e.g., U.S. Pat. Nos. 3,218,167 and 3,887,450), prepress color proofing systems (e.g., U.S. Pat. Nos. 3,136,637; 3,671,236; and 4,482,625), and as resist films for etching and plating of substrates (e.g., U.S. Pat. No. 3,526,504).

Early photopolymerizable systems tended to have fairly slow photographic speeds and required long exposure under intense radiation to fully cure. This low speed was a function of low reactivity and few reactive groups in the monomers, poor radiation absorption and low efficiency in photoinitiators, and oxygen sensitivity in the acrylate functional polymerizable systems of choice. The speed of photopolymer compositions has been greatly increased by the use of monomers and coreactive oligomers with large numbers of reactive groups thereon (e.g., U.S. Pat. Nos. 3,827,956; 4,065,627; 4,153,778; 4,228,232; and 4,304,923), higher efficiency photoinitiators (e.g., U.S. Pat. Nos. 3,775,113; 3,729,313; 3,887,450; and 4,058,401), and the use of oxygen barrier topcoats such as poly(vinyl alcohol) and copolymers of acrylic acid (e.g., U.S. Pat. No. 3,895,949).

U.S. Pat. No. 4,228,232 shows a photopolymerizable composition which is particularly good, having both good photographic speed and oxygen insensitivity, without the use of polymeric barrier coatings on its surface. The composition comprises from 10 to 60% by weight of a polyfunctional photopolymerizable oligomer, 10 to 60% by weight of a photopolymerizable monomer, 10 to 60% by weight of a binder and 0.1 to 20.0 parts by weight of a photoinitiator system comprising a photoinitiator and sensitizing dye. This composition works quite well as a printing plate photosensitive composition. However, when used in a surprint color proofing system, there is very poor adhesive transfer of the image onto the receptor surface. The use of numerous types of binders is suggested.

BRIEF DESCRIPTION OF THE INVENTION

Photopolymerizable compositions are described which are capable of being laminated after polymerization. The compositions are particularly useful in surprint processes where color prepress proofing images are transferred onto a receptor surface.

The compositions comprise 10-60% by weight of polyfunctional monomers, 10-60% by weight of polyfunctional reactive polymer, 10-60% by weight of an inert polymer which is not polymerizable in the polymerization process of the monomers and oligomers, and 0.1 to 20% by weight of a photoinitiator system. Additionally, the coatings may contain from 2 to 50% by weight of color dyes or pigments to provide a color proofing image.

DETAILED DESCRIPTION OF THE INVENTION

At least four distinct classes of materials are needed to practice the present invention. Those four classes include (1) a polyfunctional monomer, (2) a polyfunctional reactive polymer, (3) an inert, thermoplastic polymeric binder, and (4) a photoinitiator system for the monomer and polymer. The term polyfunctional, as used in the practice of the present invention to describe both the monomer and oligomer requires that there be at least two functional groups on the material which are capable of polymerizing when activated by the photoinitiator system. Preferably each polyfunctional material will have at least three polymerizable groups thereon so that extensive crosslinking can occur. It is not essential that the functional groups of the monomer and oligomer be copolymerizable, but it is highly preferred that they are copolymerizable.

Monomers

The monomeric component of the present invention comprises a free radical polymerizable compound having at least two ethylenically unsaturated groups, and preferably at least 2 to 4 ethylenically unsaturated groups selected from the groups consisting of acrylate, methylacrylate, vinyl and allyl. Preferred are compounds having multiple acrylate and methacrylate groups, e.g., acrylic esters of low molecular weight polyols, such as trimethylolpropanetriacrylate, pentaerythritol tetraacrylate and triacrylate, etc. Preferably these monomers have a molecular weight of less than 2,000 and more preferably less than 1,000.

Suitable free radical polymerizable monomers useful in the compositions of the invention are well known and listed in many patents, e.g., U.S. Pat. Nos. 3,895,949 and 4,037,021. Preferred monomers are the polyacrylate and polymethacrylate esters of alkanepolyols, e.g., pentaerythritol tetraacrylate, tris(2-acryloxyethyl)isocyanurate, tris(2-methyacryloxyethyl)isocyanurate, 2-acetoxyethyl methacrylate, tetrahydrofurfurylmethacrylate, 1-aza-5-acryloxymethyl-3, 7-dioxabicyclo [3.0.0] octane (ADOZ) bis[4-(2-acryloxyethylphenyl]dimethyl methane, diacetone acrylamide, and acrylamidoethyl methacrylate.

Initiator

The compositions of the present invention must also have a radiation sensitive system capable of initiating free radical polymerization upon absorption of radiation. Free radical initiators are materials known in the art, such as *Free-Radical Chemistry*, D. C. Nonhebel and J. C. Walton, University Press (1974). Particularly suitable free radical generators can be selected from many classes of organic compounds including, for example, organic peroxides, azo compounds, aromatic diazonium salts, aromatic iodonium salts, aromatic sulfonium salts, aromatic phosphonium salts, quinones, benzophenones, nitroso compounds, acyl halides, aryl halides, hydrazones, mercapto compounds, pyrylium compounds, triarylimidazoles, biimidazoles, chloroalkyltriazines, etc. These materials, in general, must have photosensitizers therewith to form a photoinitiator system. Photosensitizers are well known in the art. Of particular interest are aminoarylketone dyes, especially tertiaryaminoarylketones, and most particularly carboxylic acid substituted-tertiary-aminoarylketone dyes.

Additional reference in the art to free radical photoinitiator systems for ethylenically unsaturated compounds are included in U.S. Pat. Nos. 3,887,450 (e.g., column 4), 3,895,949 (e.g., column 7), and 4,043,819. Preferred initiators are the onium salts as disclosed in U.S. Pat. No. 3,729,313; and the free radical initiator counterparts of U.S. Pat. Nos. 4,058,400; and 4,058,401. Other desirable initiators are biimidazoles (disclosed in U.S. patent application Ser. No. 824,733, filed Aug. 15, 1977) and chloroalkyltriazines as disclosed in U.S. Pat. No. 3,775,113. These references also disclose sensitizers therein. Another good reference to photoinitiator system is *Light-Sensitive Systems*, J. Kosar, 1965, J. Wiley and Sons, Inc., especially Chapter 5.

Reactive Polymer

A reactive polymer is defined in the practice of the present invention as any polymeric material having at least two polymerizable groups thereon and having a molecular weight greater than that of the monomer component. Preferably the molecular weight of the reactive polymer is sufficiently high that it is a film-forming polymer by itself. This is generally indicated by a molecular weight of at least 2,000. It is also desirable that the reactive polymer swell aqueous alkaline developer having a pH of 7.5 or greater. Combinations of reactive polymers are particularly desirable in tailoring the properties of the photosensitive layer. Swellability of one component emphasizes ease of developability in aqueous alkaline solution. Non-swellability of another reactive polymer component will contribute to the cohesiveness of the photosensitive layer during development. By balancing the properties of swellable and non-swellable reactive polymer, one can provide whatever balance of ease of developability and cohesive strength that is necessary for particular product needs.

The preferred reactive polymer component of the present invention comprises a free radical polymerizable polymer or oligomer having an ethylenically unsaturated group equivalent weight of between 45 and 5000 and being of a higher molecular weight than said monomer. Some preferred oligomers are shown in U.S. Pat. No. 4,304,923 as urethane oligomers.

A generic structural formula for the urethane oligomers of that patent can be drawn as follows:

$$(E-D)_a-R(-OCA)_b$$

wherein

E is an ethylenically unsaturated, free radical polymerizable group, preferably selected from acryloyloxyalkoxy (alternatively named acryloxyalkoxy), methacryloyloxyalkoxy (alternatively named methacryloxyalkoxy), vinylalkoxy, and allyloxy, D is the residue of a polyisocyanate (preferably a diisocyanate) having at least two of its —N=C=O groups reacted to form

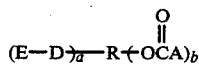
—NHC— groups

D bonding E to R,

A is a carboxylic acid containing group (e.g.,

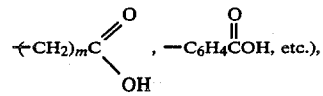

a is a number having an average value between 2 and 20, b is a number having an average value between 0.3 and 10, and m = 1 to 6, R is the residue of a polyol having at least a+b hydroxyl groups and a number of average molecular weight between 90 and 10,000, the residue formed by removal of hydrogen from the hydroxyl groups.

The backbone of the oligomer, group R, may be any aromatic or aliphatic polyol having a molecular weight between 90 and 10,000. The backbone of the oligomer may be any oligomer with the requisite molecular weight and number of hydroxyl groups, but polyesterpolyols and polyoxyalkylene polyols are preferred. Linear oligomeric polyols are useful but the branched or three-dimensional polyols such as polycaprolactone polyols are preferred. The backbone may be prepared by any of the many well known methods of forming polyhydroxyl substituted oligomers having a molecular weight between 90 and 10,000. The polyols must have a hydroxy equivalent weight of between 45 and 5,000 to be useful according to the present invention. Preferably the polyol has a hydroxy equivalent weight between 90 and 4,000 and most preferably between 200 and 2,000.

The oligomer's backbone may be homopolymeric, copolymeric, graft polymeric, or mixtures thereof. For example, polycaprolactone polyols may be used, or lower molecular weight polycaprolactone polyols (average molecular weights of less than, for example, 500) may be joined by polyacids (preferably dicarboxylic acids) or by polyisocyanates (preferably diisocyanates) to form higher molecular weight oligomer backbones.

Other useful reactive polymers include the reaction of a styrene-maleic anhydride copolymer and hydroxyethylmethacrylate. That reaction is effected by simply heating the two materials in a non-reactive solvent. An example of a particularly useful class of non-swellable reactive binders is acrylate functional cellulose esters. A preferred example of that class is the reaction product of cellulose acetate proprionate and isocyanatoethylmethacrylate.

Adhesion Promoting Resin

The adhesion promoting resin component of the present invention comprises an organic, polymeric thermoplastic adhesion promoting resin having a molecular weight of at least 1,000 which is not reactive with the polymerization mechanism of the monomer or reactive polymer. It is important that the binding resin have a glass transition temperature (Tg) or softening point between 100° F. (38° C.) and 400° F. (205° C.) and that the resin in bulk form at a temperature between 150° F. (63° C.) and 400° F. (205° C.) has a viscosity of less than $10^3$ poise (preferably at 400° F. the bulk material has a viscosity of less than or equal to $10^3$ poise). It is also further preferred that there is no plateau in the viscosity between 100° F. and 400° F. These extended plateaus (at a change of temperatures of at least 15° C.) indicate molecular entanglement which retards the flow properties of the binder resin and makes is less useful as a binding material. To be non-reactive with the reactive polymer and monomer, the resin must be able to pass the following test: 5 grams of the candidate resin, 3 grams of pentaerythritol tetraacrylate, 0.4 grams of diphenyliodonium hexafluoroantimonate and 0.4 grams of 4,4'-bis(dimethylamino) benzophenone sensitizing dye are dissolved in organic solvents (e.g., methylethylketone, isopropanol, ethylacetate, n-propanol/water azotrope, and mixtures thereof), and then irradiated for 15 seconds to a carbon arc having a 5,000 watt output at a distance of about 1 meter. If at least 90% by weight of the resin can be separated from the polymerized acrylate by leaching or other differential solvent techniques, the resin is non-reactive according to the teachings of the present invention.

Of the many different classes of resins disclosed in U.S. Pat. No. 4,228,232, only two classes are potentially non-reactive according to the present invention and do not include the preferred class of polyketone resins. The patent teaches polyesters and polyacrylates generically, but does not teach the need for thermoplastic properties to be exhibited after polymerization and yet provide ease of clean developability. Furthermore, the generic classes of resins described do not necessarily have the properties needed for the present inventions. For example, the most common linear saturated polyesters (e.g. film base quality polyethyleneterephthalate) would not be useful in the present invention. The preferred resins of the present invention are polyketones, particularly polyketones having a molecular weight between 1,000 and 50,000. Preferably polyketones with a molecular weight between 1,000 and 10,000 are used.

The resins should be heat-softenable between 100° and 400° F. (38° C. to 205° C.). It is also particularly useful to the present invention that the resin not be soluble in at least one solution selected from the class consisting of aqueous alkaline solutions at a pH of 9.0 (e.g., water and NaOH), aqueous alcohol solutions (e.g., water and n-propanol, 80/20 blend), and organic solutions (e.g., toluene/ethyl acetate, 50/50 blend). The inability of the resin to be solubilized by at least one of these solutions assists in preserving desired properties during the development process. If the resin is not solubilizing and leached from the polymerized areas, its desirable thermoplastic properties will be preserved in the polymerized image areas, enabling subsequent transfer.

When used as a photopolymerizable composition in a color prepress proofing sheet, the composition should of course contain pigments and/or dyes. These colorants (the pigments or dyes) should be present in an amount sufficient to provide a transmission optical density of at least 0.3 measured by transmission at the λ max of the colored or white light in the case of black colorant. The colorants are usually yellow, cyan, magenta or black, with essentially only one color present in the composition. The optical density should be available in a dye coating weight of less than 210 mg/ft$^2$ (25 mg/m$^2$).

These and other aspects of the invention will be shown in the following non-limiting examples.

EXAMPLE 1

The following coating solution was made by mixing:
25 gms pentaerythritol tetraacrylate
15 gms oligomer described in Preparation II of U.S. Pat. No. 4,304,923
15 gms polyketone resin (Lawter 1717B) believed to be the polymerization product of cyclohexanone and formaldehyde
6.75 gms OIPF$_6$ (diphenyliodonium hexafluorophosphate)
2.20 gms [(Me$_2$N O C=C)$_2$ C=O], (p-dimethylaminobenzyl acetone)
200 gms a 5% Regal 300 Carbon (Cabot) black dispersion made by ball milling the carbon black in a glass jar with glass marbles in 112 trichloroethane solvent. This dispersion also contained 1% Formvar 1595E (Monsanto) as a dispersing aid.
800 gms 112 Trichloroethane This solution was coated on a polyester substrate having a subbing layer comprised of a polyurea resin to provide a black photopolymer layer having an optical density of 0.70 as measured by white light transmission. The coating was dried in an oven for 1 minute at 70° C. The dry coating was overcoated with a polyvinyl alcohol topcoat at a coating weight of 70 mgs/ft$^2$ by using a water solution of 5% Monsanto Gelvatol 20-30. The solution also contained 0.5% by weight Rohm & Haas X-200 wetting agent.

The above coated film was contact exposed with a photographic negative, then developed with a 1.5% sodium hydroxide solution and air dried.

A thermal adhesive coated paper was prepared by coating a 10 percent solution of Goodyear PE222 polyester resin dissolved in methylethylketone (hereinafter MEK) onto 3M Matchprint Commercial Negative proofing paper. The coating weight was 1.0 gms/ft$^2$ after the MEK had evaporated.

The developed film was placed image side in contact with the thermal adhesive on the paper and laminated using the heated rolls of a 3M Model 447 Proofing Laminator. The roll set temperatures were 240° F. for the top roll and 150° F. for the bottom roll. The laminating speed was 20 inches/minute.

Results: When the laminate had cooled, the polyester film was peeled from the paper leaving the black image embedded in the thermoplastic.

A second image film was prepared and laminated in register to the previously imaged paper.

This created one image of double thickness on the paper. No black image remained on the peeled films. These results demonstrate that the materials of this invention are capable of complete transfer during lamination whether the image is bonded to thermal adhesive or to the previous color. This is the requirement in order to make a color proof since it is necessary to produce both primary and secondary colors.

EXAMPLE 2

The process of Example 1 was repeated. However, prior to lamination the films were placed in contact with an inverted fluorescent light fixture having two 40 watt, 48 inch lamps (#F40CW) for 20 hours. This exposure stimulated an extended post exposure that may be encountered if the films were first used as an overlay prior to making a single sheet proof.

Results: The laminations were complete as seen as in Example 1 with no image remaining on the polyester film subbings.

EXAMPLE 3

The samples were made, post exposed as in Example 2 and laminated with and without post exposure.

The difference in this example was that the Lawter 1717B polyketone resin was left out of the coating formulation.

Results: The post exposed would not adhere to a previous color. Thus the production of secondary colors would not be possible. Transfer was complete in the absence of post exposure.

EXAMPLE 4

In this example 15 gms of the polyketone resin (1717B) in 85 gms of 112 trichloroethane was reacted with 2 gms of isocyanotoethylmethacrylate at 80° C. for 6 hours in the presence of 0.2 gms of dibutyltin dilaurate catalyst. This resulted in methacrylate functional polyketone resin. This was used in place of the unreacted 1717B of the Example 1 formulation.

The post exposure-lamination test of Example 3 was performed on this composition.

Results: The results of Example 3 were obtained, (i.e., post exposed images would not laminate). This example demonstrates that the polyketone resin cannot provide hot melt adhesive properties if it is reactive with the monomers and oligomers of the construction.

EXAMPLE 5

In this example a Union Carbide resin ZKRA-252, which is believed to be substantially the polymerization product of vinyl benzyl ketone, was used in place of the polyketone resin of Example 1.

Results: The results of Example 2 were obtained, (i.e., post exposed images laminated as well as those not post exposed).

EXAMPLE 6

In this example Dupont Elvacite #2008, which is a low molecular weight methyl methacrylate polymer, was used in place of the 1717B of Example 1. The #2008 was unsatisfactory from the standpoint of proper development since some resin and pigment remained in the nonlight struck areas. However, the lamination properties were satisfactory.

EXAMPLE 7

In this example the resins of the previous examples were tested to determine qualitatively their tendency to become part of a polymerization network.

Solutions were made of:
2 gms pentaerythritrol tetraacrylate
2 gms resin
0.3 gms diphenyliodonium hexaphorophosphate
0.1 gms p-dimethylaminobenzyl acetone
50 gms 1,1,2-trichloroethane These solutions were allowed to dry in a 4 inch diameter evaporating dish, then exposed to room light for one week.

The polymerized product was then extracted with 1,1,2-trichloroethane. The soluble portion was dried and weighed. The results are listed below.

| Resin | Soluble Portion |
|---|---|
| None | 0.2 grams |
| Example 1 1717B | 2.1 grams |
| Example 4 reacted 1717B | .4 grams |
| Example 5 ZKRA | 2.0 grams |
| Example 6 Elvacite 2008 | 1.8 grams |

These results indicate that satisfactory laminating properties are obtained only when an adhesive resin is present which does not react to become part of the photopolymerized network.

EXAMPLE 8

In this example 4 gms of 1717B was used in the formulation of Example 1.

Results: Post exposed samples did not laminate completely, with substantial color remaining on the film in the form of somewhat random deposits.

This example demonstrates that at least 10% by weight of the resin-monomer-oligomer must be non-reactive resin.

EXAMPLE 9

In this example, 15 grams of a low molecular weight polyester resin (Goodyear PE200) was used in place of the polyketone of Example 1. Good adhesion during transfer was achieved, but as with the poly(methylmethacrylate) resin (Elvacite ®) of the previous example, residual polymer tended to remain in the unexposed areas after development. These materials are therefore functional adhesive resins, but are significantly less preferred. Only the polyketones consistently performed at the highest level in all respects.

I claim:

1. An aqueous alkaline developable photopolymerizable composition capable of being imagewise transferred after photopolymerization and development comprising:
   (1) a polyfunctional photopolymerizable monomer,
   (2) a polyfunctional photopolymerizable polymer which will swell in an aqueous alkaline developer having a pH of 7.5,
   (3) an inert, thermoplastic polymeric binder, and
   (4) a photoinitiator system for said monomer and polymer, said polymeric binder being non-reactive with the polymerization mechanism of said monomer and polymer, the polymeric binder being not soluble in at least one solution selected from the class consisting of aqueous alkaline solutions at a pH of 9.0, aqueous alcohol solutions, and organic solutions, said polymeric binder in bulk form having a glass transition temperature or softening point between 38° C. and 205° C. and a viscosity of $10^3$ poise or less between 63° C. and 205° C. and said composition further containing a colorant in sufficient concentration to provide an optical density of at least 0.3 by having 2 to 50% by weight of colorant in said composition.

2. The composition of claim 1 wherein both said monomer and polymer are ethylenically unsaturated.

3. The composition of claim 2 wherein both said monomer and polymer have ethylenically unsaturated groups selected from the class consisting of acryloyl and methacryloyl groups.

4. The composition of claim 1 wherein said monomer comprises 10–60% by weight of said composition, said polymer comprises 10–60% by weight of said composition, said polymeric binder comprises from 10–60% by weight of said composition and said photoinitiator system comprises from 0.1 to 20% by weight of said composition.

5. The composition of claim 3 wherein said monomer comprises 10–60% by weight of said composition, said polymer comprises 10–60% by weight of said composition, said polymeric binder comprises from 10–60% by weight of said composition and said photoinitiator system comprises from 0.1 to 20% by weight of said composition.

6. The composition of claim 1 having sufficient amount of a colorant therein to provide a transmission optical density to light of at least 0.3 at a dried coating weight of 25 mg/m$^2$.

7. The composition of claim 3 having sufficient amount of a colorant therein to provide a transmission optical density to light of at least 0.3 at a dried coating weight of 25 mg/m$^2$.

8. The composition of claim 5 having sufficient amount of a colorant therein to provide a transmission optical density to light of at least 0.3 at a dried coating weight of 25 mg/m$^2$.

9. The composition of claim 1 wherein said polymeric binder comprises a polyketone resin.

10. The composition of claim 3 wherein said polymeric binder comprises a polyketone resin.

11. The composition of claim 5 wherein said polymeric binder comprises a polyketone resin.

12. The composition of claim 6 wherein said polymeric binder comprises a polyketone resin.

13. The composition of claim 7 wherein said polymeric binder comprises a polyketone resin.

14. The composition of claim 8 wherein said polymeric binder comprises a polyketone resin.

15. A color prepress proofing element capable of being imagewise laminated to a surface after exposure and development comprising a support having on at least one surface thereof a strippable layer comprising the composition of claim 1.

16. A color prepress proofing element capable of being imagewise laminated to a surface after exposure and development comprising a support having on at least one surface thereof a strippable layer comprising the composition of claim 3.

17. A color prepress proofing element capable of being imagewise laminated to a surface after exposure and development comprising a support having on at least one surface thereof a strippable layer comprising the composition of claim 5.

18. A color prepress proofing element capable of being imagewise laminated to a surface after exposure and development comprising a support having on at least one surface thereof a strippable layer comprising the composition of claim 8.

19. A color prepress proofing element capable of being imagewise laminated to a surface after exposure and development comprising a support having on at least one surface thereof a strippable layer comprising the composition of claim 11.

20. A color prepress proofing element capable of being imagewise laminated to a surface after exposure and development comprising a support having on at least one surface thereof a strippable layer comprising the composition of claim 14.

21. A color prepress proofing element capable of being imagewise laminated to a surface after exposure and development comprising a support having on at least one surface thereof a strippable layer comprising the composition of claim 9.

22. A color prepress proofing element capable of being imagewise laminated to a surface after exposure and development comprising a support having on at least one surface thereof a strippable layer comprising the composition of claim 10.

23. A color prepress proofing element capable of being imagewise laminated to a surface after exposure and development comprising a support having on at least one surface thereof a strippable layer comprising the composition of claim 12.

24. A color prepress proofing element capable of being imagewise laminated to a surface after exposure and development comprising a support having on at least one surface thereof a strippable layer comprising the composition of claim 13.

* * * * *